United States Patent [19]

Gilmore

[11] Patent Number: 4,965,533

[45] Date of Patent: Oct. 23, 1990

[54] DIRECT DIGITAL SYNTHESIZER DRIVEN PHASE LOCK LOOP FREQUENCY SYNTHESIZER

[75] Inventor: Robert P. Gilmore, San Diego, Calif.

[73] Assignee: Qualcomm, Inc., San Diego, Calif.

[21] Appl. No.: 401,152

[22] Filed: Aug. 31, 1989

[51] Int. Cl.$^5$ .................................................. H03L 7/18
[52] U.S. Cl. ........................................ 331/18; 331/25
[58] Field of Search ..................... 331/1 A, 2, 18, 25; 328/14

[56] References Cited

U.S. PATENT DOCUMENTS

| | | | |
|---|---|---|---|
| 4,516,084 | 5/1985 | Crowley | 331/2 |
| 4,835,491 | 5/1989 | Coster | 331/2 |
| 4,868,524 | 9/1989 | Costlow et al. | 331/25 X |

Primary Examiner—Siegfried H. Grimm
Attorney, Agent, or Firm—Russell B. Miller

[57] ABSTRACT

A frequency synthesizer which uses a direct digital synthesizer (DDS) to drive a phase lock loop. The DDS generates a highly accurate periodic signal of a frequency selected from a plurality of reference frequencies. A phase lock loop receives the DDS generated reference signal and a divide-by-N signal for generating an output signal at a frequency determined by the divide-by-N signal. The frequency resolution of the phase lock loop is N times the reference signal.

In a second embodiment, the DDS is incorporated within the feedback path of the phase lock loop. An input reference frequency signal is provided to the phase lock loop with the DDS clock signal provided as a function of the phase lock loop output frequency. The DDS receives an input frequency control signal which determines the DDS step size. The synthesizer output frequency is a function of the input reference, the number of bits in the digital word of the frequency control signal and the DDS step size as determined by the frequency control signal. Optional dividers may be provided in the feedback path which may further affect the synthesizer output frequency.

19 Claims, 3 Drawing Sheets

DIRECT DIGITAL SYNTHESIZER DRIVEN PHASE LOCK LOOP FREQUENCY SYNTHESIZER

BACKGROUND OF THE INVENTION

I. Technical Field

The present invention relates to phase lock loop frequency synthesizers. More specifically, the present invention relates to a novel and improved method of phase lock loop frequency synthesis whereby the reference signal for the phase lock loop is provided by a direct digital synthesizer (DDS) capable of generating any one of a plurality of periodic reference signals, each having a different periodic frequency.

II. Background Art

Conventional frequency synthesis is often accomplished with the use of one or more phase lock loops. A phase lock loop is designed to output a signal at a range of frequencies with frequency resolution, or step size, equal to the loop reference frequency.

Conventional phase lock loops synthesize a frequency by using a control voltage to drive a voltage controlled oscillator (VCO) which generates a signal of a frequency near the desired frequency. A frequency divider is used to divide the VCO signal output frequency by an integer value. The integer value is chosen such that if the VCO were generating exactly the desired frequency, the resultant divided frequency signal would be exactly the same frequency as a reference frequency.

The divided frequency signal is input along with the reference frequency signal to a phase detector. The phase detector compares the frequencies of the two input signals and outputs a voltage proportional to the difference in frequency of the two input signals. The output of the phase detector is coupled through a loop filter, necessary to insure loop stability, where it is input to the VCO as the control voltage. Accordingly, the output signal from the VCO is adjusted to a frequency exactly that of the desired frequency.

The performance of a phase lock loop is related to several factors including (1) the frequency of the reference signal, (2) the magnitude of the divisor necessary to divide the output frequency down to the reference frequency, and (3) the bandwidth of the loop filter. The frequency of the reference signal dictates the frequency resolution, or step size of the loop, i.e. the smaller the reference frequency, the greater the frequency resolution. The magnitude of the loop divisor has great impact on the noise performance of the loop. As such, any phase noise or spurious noise in the reference frequency will appear in the loop output having its original magnitude multiplied by the loop divisor. The bandwidth of the loop filter, which is normally five to ten percent of the reference frequency, impacts the speed with which the loop can settle on a new frequency. Thus the narrower the loop filter bandwidth, the slower the loop will be able to settle on the new frequency.

These performance factors suggest the difficulty in designing a phase lock loop with narrow channel spacing, while maintaining a broad range of output frequencies. If the VCO output signal frequency is very large relative to the reference signal frequency (and therefore the frequency step size), the loop divisor must be very large. Therefore, any noise in the reference signal will appear on the loop output multiplied by a very large value. For this reason, conventional frequency synthesizers often comprise two or more phase lock loops. Each phase lock loop is of differing frequency resolution and corresponding output frequency range. In such a configuration the output of a coarse resolution loop, with a relatively large frequency range, can be mixed with the output of a fine resolution loop with a narrow frequency range. This combination of coarse and fine resolution loops results in a loop which is capable of providing a narrow frequency step size over a broad range of frequencies.

There are many disadvantages to the conventional multiple loop phase lock loop synthesizer. Increasing the number of loops increases the quantity and cost of required hardware, as well as the power and space requirements of the synthesizer. Also, although employing a separate fine resolution loop of limited output range narrows frequency step size, there remains a tradeoff between this resolution and switching speed. This tradeoff exists because the bandwidth of the loop filter, which dictates the switching speed, can be no more than five to ten percent of the reference frequency (and therefore the frequency step size). A further disadvantage of a multiple loop synthesizer is the mixing of the loop outputs creates substantial undesirable wideband spurious noise in the resultant output signal.

It is therefore an object of the present invention to provide a novel and improved phase lock loop frequency synthesizer which requires substantially less hardware, space, and power than the conventional phase lock loop and multi-loop frequency synthesizer.

It is a further object of the present invention to provide a novel and improved phase lock loop frequency synthesizer which requires only one phase lock loop, yet has substantially greater frequency resolution and frequency range than the conventional frequency synthesizer.

Yet another object of the present invention is to provide a novel and improved phase lock loop frequency synthesizer which has substantially faster frequency switching time than a conventional frequency synthesizer of comparable frequency resolution and frequency range.

It is a further object of the present invention to provide a novel and improved phase lock loop frequency synthesizer which has substantially less wideband spurious noise in its output than the conventional multi-loop frequency synthesizer of comparable frequency resolution and frequency range.

SUMMARY OF THE INVENTION

In one preferred embodiment of the present invention a phase lock loop uses a direct digital synthesizer (DDS) to provide the loop reference frequency. The DDS produces digitized periodic frequencies by accumulating phase at a higher rate consistent with sampling theory, translating the phase into a periodic waveform via a lookup table, and converting the resulting digital representation of the periodic wave to an analog signal using a digital to analog converter.

In the one preferred embodiment the analog signal provided by the DDS serves as the source of the reference frequency for the phase lock loop. The phase lock loop frequency synthesizer of the present invention makes coarse output frequency adjustments, in increments of the nominal referenced frequency, by varying the loop divisor value. The phase lock loop frequency synthesizer of the present invention makes fine output frequency adjustments by varying the DDS output frequency, e.g. the source of the phase lock loop reference frequency. Therefore, the fine adjustment increment is the frequency resolution of the DDS output multiplied by the value of the loop divisor.

Given a DDS driven phase lock loop of configuration such as that of the present invention, the phase lock loop can operate with a relatively high nominal referenced frequency, thus allowing for a loop filter of relatively wide bandwidth. Accordingly the phase lock loop can therefore operate with a relatively fast switching time. In such a phase lock loop very fine output frequency step size changes may be realized because the step size is the loop divisor multiplied by the resolution. Such step size changes are typically several orders of magnitude finer than a conventional fine tune phase lock loop.

Therefore, the preferred embodiment offers substantially greater output frequency resolution over the prior art devices, while also achieving substantially faster switching speeds. Further, the present invention requires only one phase lock loop and one DDS. DDS's are typically VLSI devices and therefore require relatively little space or power. Thus, the hardware, space, and power requirements of the preferred embodiment are substantially less than those of a conventional multi-loop frequency synthesizer.

The present invention also eliminates the wideband spurious noise associated with the mixing of outputs from multiple phase lock loops because the present invention requires no such mixing. The present invention further suppresses and eliminates spurious noise by coupling a DDS "clean-up" filter between the DDS output and the phase detector input of the phase lock loop. The DDS "clean-up" filter is fundamental to this invention. This filter suppresses and eliminates wideband spurs from the DDS reference before the phase lock loop multiplies the magnitude of the spurs. The phase lock loop multiplies the magnitude of the DDS spurs, not the relative frequency. Therefore, the output of the phase lock loop will contain DDS spurious tones within $\pm B/2$ of the output frequency, $f_{out}$, where B is the bandwidth of the "clean-up" filter. Spurious signals will be suppressed beyond $f_{out} \pm B/2$. This principle is ideal in situations where the synthesizer output is to be modulated, since the close-in DDS spurs can be hidden in the modulated spectrum.

A high order "clean-up" filter with sharp cut-offs can be physically realized more easily at certain frequencies. These frequencies are typically much higher than the desired phase lock loop reference frequency. This allows for the effective placement of the "clean-up" filter center frequency, while still providing the loop with an appropriate reference frequency. The nominal output of the DDS is set at a frequency at which a good "clean-up" filter can be realized.

A fixed value frequency diVider may be positioned between the output of the "clean-up" filter and the reference input to the phase lock loop. This frequency divider divides the filtered DDS output signal down in frequency to an appropriate reference frequency for the phase lock loop. It is known that a frequency divider has the property of lowering spurious phase noise by a factor of its divisor value. Therefore the frequency divider further suppresses any narrow band spurious noise which passes through the "clean-up" filter.

The preferred embodiments of the present invention therefore provide several advantages and improvements over the prior art. These improvements include finer output frequency resolution, faster switching time, a reduction in hardware, space, and power requirements, and better noise characteristics.

BRIEF DESCRIPTION OF THE DRAWINGS

These and other features and advantages of the present invention will become fully apparent from the detailed description set forth below when taken in conjunction with the drawings in which like reference characters correspond throughout and wherein.

DETAILED DESCRIPTION OF THE PREFERRED EMBODIMENT

Figure 1:
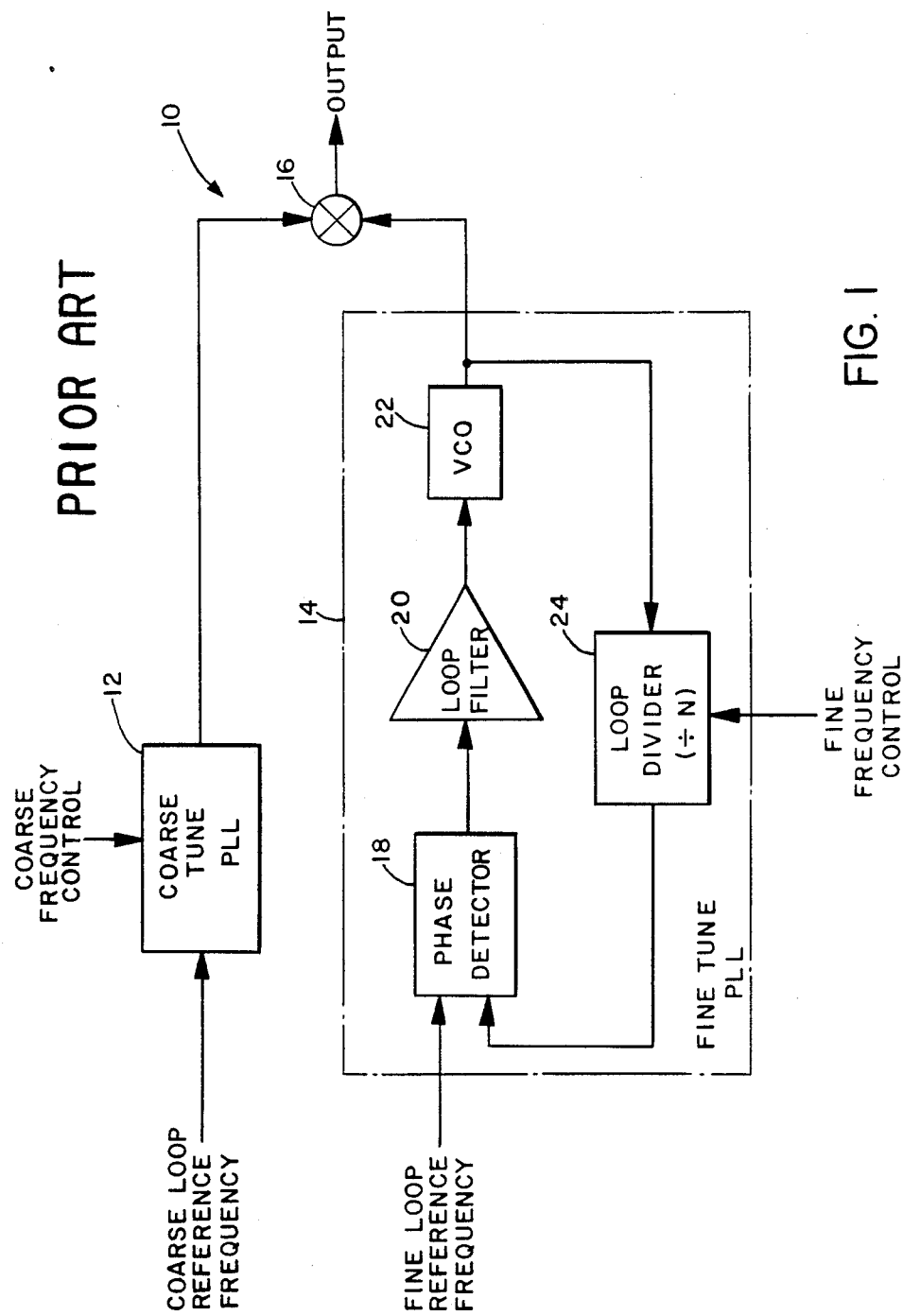
FIG. 1 illustrates a prior art conventional multiple loop phase lock loop frequency synthesizer.

The preferred embodiment of the present invention provides a great many advantages over the prior art. FIG. 1 illustrates in block diagram form a conventional multiple loop phase lock loop frequency synthesizer. Synthesizer 10 typically comprises two phase lock loops, coarse tune loop 12 and fine tune loop 14. The output of loops 12 and 14 are input to mixer 16 with the output thereof being the synthesized frequency. For purposes of illustration only the details of fine tune loop 14 are illustrated, while the coarse tune loop 12 is similarly constructed.

Fine loop 14 comprises phase detector 18 which receives at one input a reference frequency signal. The output of phase detector 18 is coupled to loop filter 20 with the output thereof coupled as the control voltage input to voltage controlled oscillator (VCO) 22. The output of VCO 22 is coupled to one input of mixer 16. The output of VCO 22 is also input to loop divider 24. The divisor value of loop divider 24, N, is set by a fine frequency control signal. The frequency divided output of loop divider 24 is provided as the other input to phase detector 18.

The switching time in such a configuration of FIG. 1 is governed by the bandwidth of the fine tune loop filter 20. For example, consider a multiple loop frequency synthesizer in which the fine tune loop has a reference frequency of 1 KHz. The synthesizer resolution is 1 KHz, and the settling time is on the order of 90 msec for a 200 MHz jump. Setting time can be improved by using a 10 KHz step loop whose output is divided by 10 to provide a 1 KHz resolution. Such a configuration would yield a settling time on the order of 9 msec.

By contrast, in the above example, the preferred embodiment of the present invention described herein offers a frequency resolution of 4 Hz, and a settling time on the order of 90 nsec, an improvement of several orders of magnitude.

The multiple loop frequency synthesizer such as synthesizer 10 usually incorporates frequency mixers, such as mixer 16 to combine the output of the loops 12 and 14. It is well known that such mixers inherently introduce spurious intermodulation products. Many broadband spurs are typically generated, as opposed to the close in and readily predictable spurs created by the preferred embodiment of the present invention.

Furthermore, conventional multi-loop synthesizers involve a large amount of circuitry and require a large amount of power, particularly if fine resolution is to be obtained. It is impractical to provide as fine a resolution as the present invention allows using a multi-loop synthesizer unless one loop is replaced by a digital direct synthesizer. However, this approach to frequency synthesis also involves a large amount of circuitry, and generates spurious intermodulation products due to the mixing required. Again by contrast, the present invention requires little circuitry and power; can be made to occupy very little space; and offers excellent frequency resolution, spurious and noise performance, and switching speed. In these respects the novel and improved frequency synthesizer of the present invention is far superior to the prior art.

Figure 2:
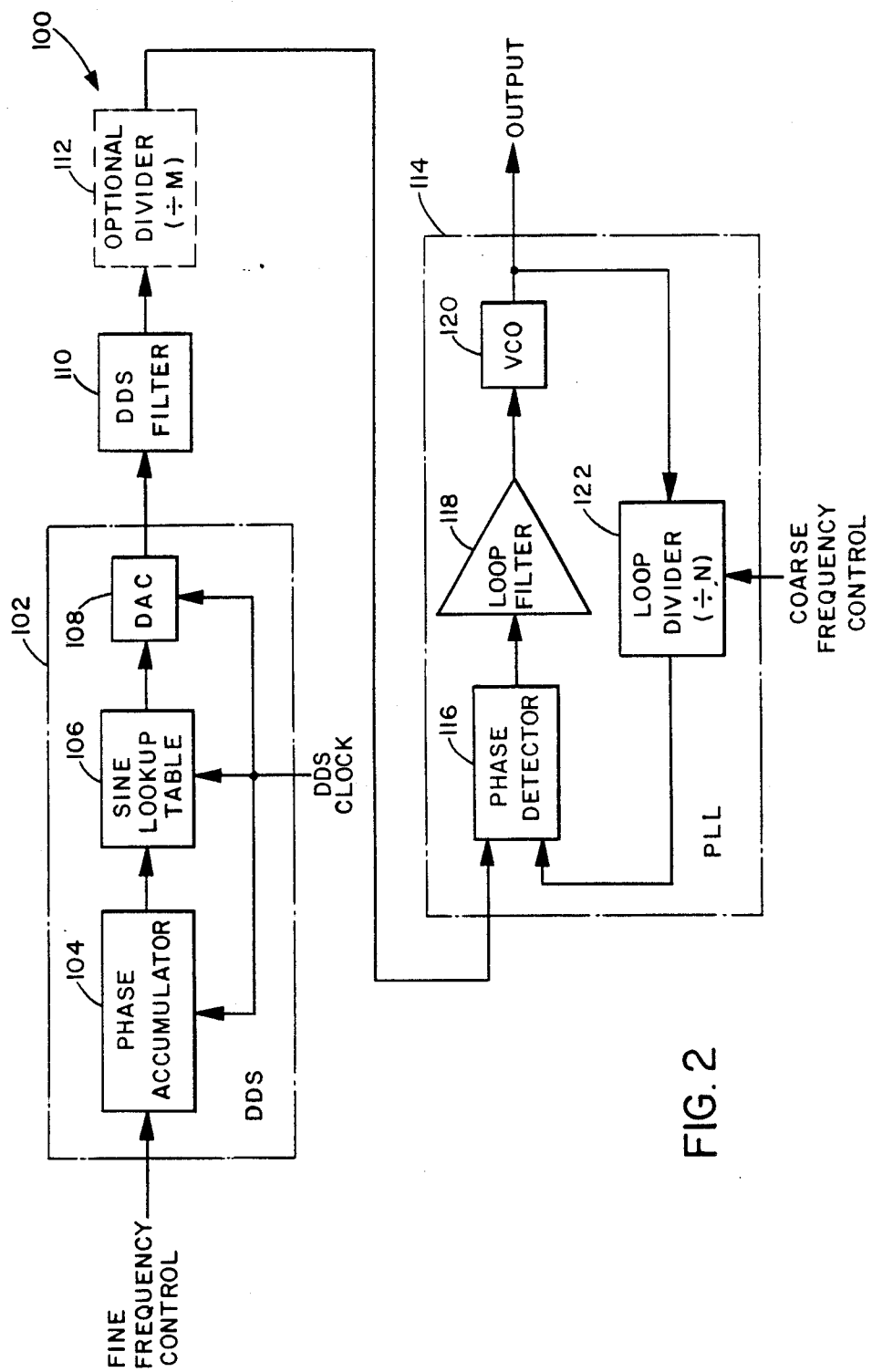
FIG. 2 illustrates one embodiment of the present invention for a direct digital synthesizer (DDS) driven phase lock loop.

FIG. 2 illustrates an exemplary preferred embodiment of the direct digital synthesizer driven phase lock loop frequency synthesizer 100 of the present invention. Direct digital synthesizer (DDS) 102 serves as a variable reference source means for generating a selected one of a plurality of reference frequency signals, each at a different frequency. The digital direct synthesizer utilized in the present invention is well known in the art.

DDS 102 typically comprises phase accumulator 104, sine lookup table 106 and digital to analog converter (DAC) 108. Phase accumulator 104 receives a digital fine frequency control signal which determines the phase increment for accumulation at the DDS clock rate. The accumulated phase value is output to sine lookup table 106, typically a read only memory which stores sine values. Sine lookup table 106 provides an output signal, indicative of the digital representation of a periodic waveform, as an input to DAC 108. DAC 108 converts the digital representation of the periodic waveform into an analog amplitude value as the output reference signal which is an analog representation of the periodic waveform. DDS 102 is responsive to the fine frequency control signal for altering the frequency of the output reference signal. DDS 102 is further responsive to a direct digital synthesizer clock signal with which its internal digital hardware is driven.

The output from DDS 102, specifically DAC 108, is provided to an input of direct digital synthesizer "cleanup" filter 110. Filter 110 serves as a filter means for enhancing the spectral purity of the reference signal output from DAC 108, and for providing the enhanced reference signal as input to an optional frequency divider 112.

Divider 112 serves as a reference signal divider means for generating a divided reference signal having a periodic frequency equal to the frequency of the enhanced reference signal divided by a predetermined integer value, M. The frequency divided reference signal is provided to phase lock loop 114 as the phase lock loop reference frequency.

In the preferred embodiment phase lock loop 114 is comprised of phase detector 116, loop filter 118, VCO 120 and loop divider 122. Phase lock loop 114 serves as a frequency tuning means for generating a loop output signal having a periodic frequency which is an integer multiple of the frequency of the input reference signal.

One input of phase detector 116 is coupled to the output of filter 110, or divider 112 if provided. The output of phase detector 116 is coupled to an input of loop filter 118, typically constructed as an op amp filter. The output of loop filter 118 is coupled to the control input of VCO 120. The output of VCO 120 is provided as the phase lock loop output signal and is also fed back to an input of loop divider 122. The output of loop divider 122 is coupled as the other input of phase detector 116.

Phase detector 116 serves as a comparator means for comparing the DDS circuitry provided reference signal to the divided loop output signal. Phase detector 116 is responsive to a difference in frequency of the reference signal from the DDS circuitry and the divided loop output signal for generating a frequency tuning control signal. Phase detector 116 generates the frequency tuning control signal whose voltage level is proportional to the difference in frequencies of the compared signals.

Loop filter 118 serves as a tuning control signal filter. Loop filter 118 receives and filters the frequency tuning control signal and provides a VCO control signal. The VCO control signal is provided to the voltage control input of VCO 120.

VCO 120 serves as a frequency generation means for generating the loop output signal in response to the VCO control signal. Specifically, VCO 120 alters the frequency of the loop output signal in response to a change in the voltage level of the input VCO control signal.

Loop divider 122 is coupled to the output of VCO 120 so as to receive the loop output signal. Loop divider 122 serves as a loop divider means which receives the loop output signal and generates a divided loop signal which corresponds in frequency to the loop output signal divided by N. The divided loop signal is provided to the other input of phase comparator 116. Loop divider 122 is responsive to a coarse frequency control signal for setting the integer divisor value by which the loop output signal frequency is divided for feedback to phase detector 116.

In operation, the DDS produces digitized periodic waveforms, typically a sine wave, of a given frequency by accumulating phase at a higher rate. The accumulated phase is translated to a periodic waveform via a lookup table. The resulting digital representation of the periodic waveform is translated to analog form using a digital to analog converter.

Phase lock loop 114 is designed to output a range of frequencies where the frequency resolution is equal to its reference frequency. For example, phase lock loop 114 is designed for loop output signals that can vary from 200–400 MHz. If the reference frequency applied to phase lock loop 114 is 10 MHz, the possible outputs from phase lock loop 114 are 200, 210, 220, 230, . . . , 390, and 400 MHz. The frequency of each phase lock loop output signal is the division ratio of the loop, the value by which output divider 122 divides, multiplied by the reference frequency. For example, loop divider 122 is set to divide the loop output frequency by 27 (N=27) to generate a loop output signal at a frequency of 270 MHz. By using a DDS as the reference to the loop, the reference frequency may be made to vary in extremely small steps. Note that the step size of the DDS driven phase lock loop varies with the divisor value of the loop divider (N), and is therefore not constant throughout the range of output frequencies.

Filter 110 is a critical component in the present invention. Preferably filter 110 is of a bandpass design, having as narrow a bandwidth and as steep a roll-off as possible. This filter may therefore be a crystal filter or a surface acoustic wave (SAW) filter. Use of the optional divider 112 provides versatility in selection of the center frequency of filter 110. For example, it is sometimes difficult to obtain a crystal filter with a center frequency of 1 MHz, but straightforward to specify a center frequency of 10 MHz. A design which requires a reference frequency to phase lock loop 114 of 1 MHz can therefore be realized. Accordingly, a DDS output signal with its frequency centered at 10 MHz, is provided as an input to a 10 MHz crystal filter. The output of the crystal filter is provided to a fixed divide by 10 divider before being applied at the phase lock loop input. Divider 112 has the added benefit of reducing the amplitude of the DDS phase noise and spurious content by 20 log(M) dB, where M is the fixed division ratio.

The spurious performance of the preferred embodiment of the present invention is readily analyzed. The DDS output includes spurious signals typically caused by phase truncation of the output waveform, amplitude quantization of the waveform, nonlinearities of the DAC output, and aliases attributable to the sampling process. The phase noise in the DDS output is governed by the phase noise characteristics of the DDS clock signal, as well as the noise performance of the digital circuitry comprising the DDS.

Phase lock loop 114 acts as a low pass filter to signals applied to its reference input. In the case of a second order loop, the loop has second order low pass filter characteristics with a bandwidth equal to the phase lock loop bandwidth. Reference spurs and phase noise are multiplied in the loop by the factor N in voltage or 20 log(N) in dB, where N is the divisor value of loop divider 122. The loop output signal is therefore characterized by the output frequency surrounded by a bandpass spectrum of multiplied reference spurs and phase noise. In the absence of filter 110, this spectrum is the spurious content of the DDS output plus 20 log(N) dB, and suppressed by 12 dB per octave outside of the phase lock loop bandwidth. Filter 110 is utilized to provide suppression of spurious signals and phase noise, particularly those originating at the DDS output.

One significant property of a phase lock loop is that it multiplies the amplitude of the DDS spurious signals by N. However, the frequency difference between the phase lock loop synthesizer output frequency and the spur remains the same as that between the DDS output frequency and the DDS spur frequency. Depending upon the amplitude of the DDS spur with respect to the DDS output frequency, an FM modulation of the phase lock loop synthesizer output may occur. This modulation produces a family of spurs harmonically related to the DDS spur, decreasing in amplitude with the order of the harmonic. These FM spurs remain close in to the synthesizer output frequency and in general fall off rapidly. Therefore, spurs may be present at the synthesizer output within a bandwidth equal to that of filter 110 surrounding the output frequency. But beyond this the output can be made arbitrarily clean by selecting a filter 110 with a sufficient shape factor and ultimate attenuation.

As an illustrative example of the preferred embodiment of the present invention, consider again the example of a synthesizer required to output a frequency in the range of 200 to 400 MHz. Assume that phase lock loop 114 has 1 MHz step resolution. The reference input to phase lock loop 114 is centered at 1 MHz, and the value of the divisor of loop divider 122, N, is in the range $200 \leq N \leq 400$. The output of the synthesizer is in steps of N times the reference frequency input to the phase lock loop from the DDS and clean-up filter. The DDS must output a range of frequencies sufficient to bridge the 1 MHz phase lock loop resolution. The bandwidth of the output of the DDS is therefore the loop frequency resolution divided by the minimum value of N, e.g. 1 MHz/200 which equals 5 KHz. The DDS must therefore output a signal at 1 MHz$\pm$2.5 KHz.

The resolution of the synthesizer is that of the DDS times N. With a typical DDS frequency resolution of 0.01 Hz, the synthesizer resolution varies from 2 Hz at the low frequency end to 4 Hz at the high frequency end. Ignoring transient response issues, filter 110 can be made as narrow as possible, i.e. approximately 6 KHz, 1 dB bandwidth. The synthesizer will output spurious signals attributable to the DDS within $\pm$3 KHz of the output tone, and falling off per the characteristic of filter 110 plus the loop response. The maximum level of these spurious signals in dB is the maximum level of the DDS spurs within the clean-up filter bandwidth plus 52 dB, where 52 dB is 10 log($N_{max}$), i.e., 10 log(400). Similarly, DDS phase noise is multiplied by 52 dB maximum, and is filtered both by filter 110 and the loop response. The synthesizer therefore produces close in spurious signals and a close in phase noise pedestal due to the reference, but no theoretical spurs far beyond the clean-up filter and loop bandwidth.

The transient response and switching time of the design of the present invention is established by the bandwidth of filter 110 and the loop characteristics of phase lock loop 114. A DDS has switching times typically less than 100 nsec, and therefore does not significantly effect the switching time. The settling time of a phase lock loop is inversely related to the loop bandwidth. To maintain loop stability, the loop bandwidth of a phase lock loop can typically be no wider than five to ten percent of the frequency step size. The design of the present invention provides for a synthesizer with a remarkably fine frequency resolution with a phase look loop having a relatively large frequency step size, and therefore a wide permissible loop bandwidth. The phase lock loop of the present invention will settle very quickly.

Therefore, in the preferred embodiment of the present invention switching time will be governed by the transient characteristic of filter 110, rather than the loop bandwidth of phase lock loop 114. The selection of filter 110 is a tradeoff between the spurious noise performance and switching speed of the synthesizer.

Note that in the above example DDS, 102 and filter 110 could have been centered at 10 MHz and followed by divider 112 with a divisor value of 10. This circuitry would provide the 1 Mhz$\pm$2.5 KHz input to phase lock loop 114. The bandwidth of the filter 110 at 10 MHz would be approximately 60 KHz, providing faster settling time than the 6 KHz design. While the wider bandwidth clean-up filter passes a greater range of DDS spurs and noise, this is offset somewhat by the 20 dB improvement afforded by divider 112.

Figure 3:
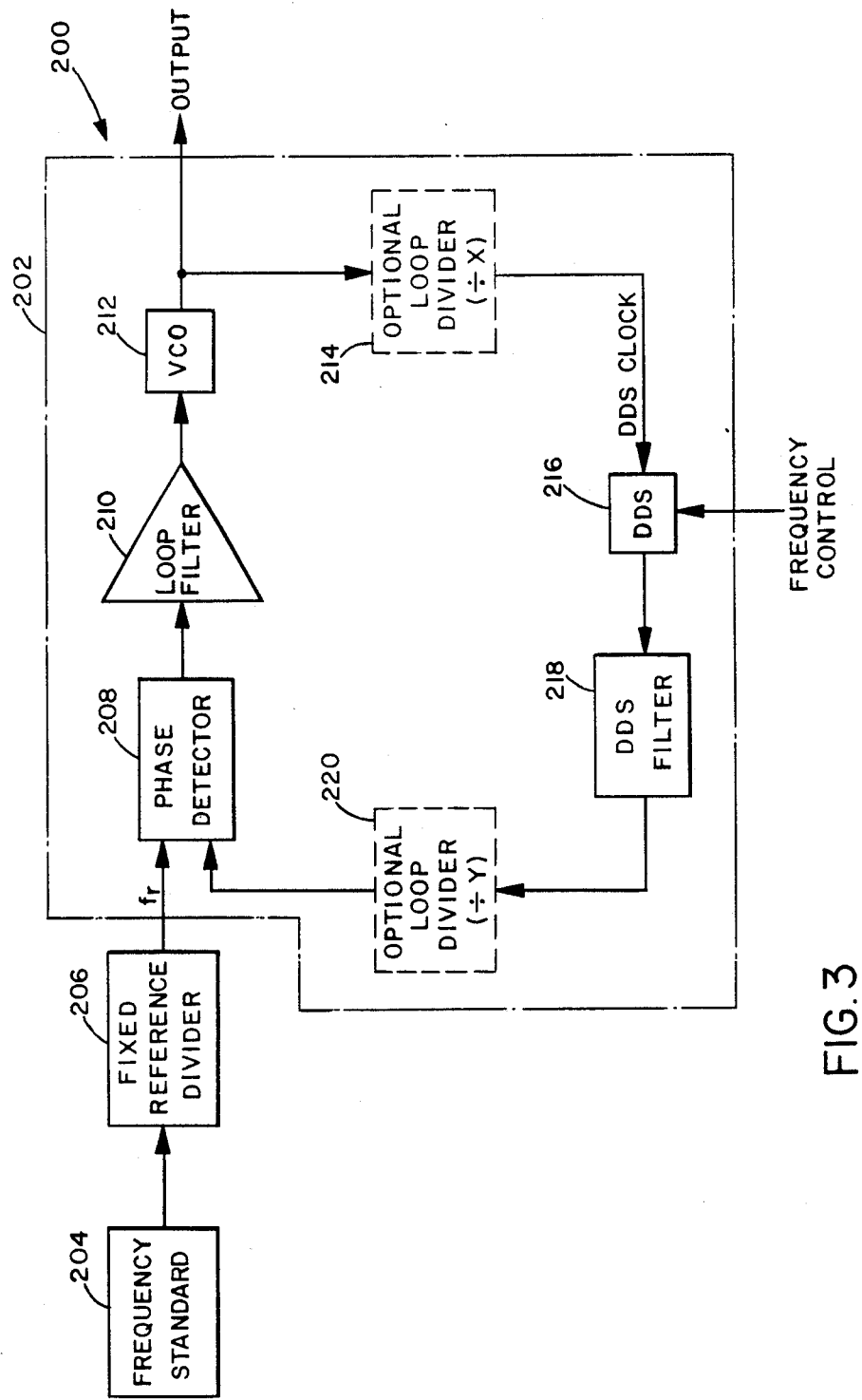
FIG. 3 illustrates an alternative embodiment with the DDS within the phase lock loop.

FIG. 3 illustrates in block diagram form an alternate embodiment which incorporates a DDS within the phase lock loop. In FIG. 3, synthesizer 200 includes circuit 202 which comprises a phase lock loop incorporating within the loop a direct digital synthesizer. Circuit 202 receives a reference frequency, typically from a frequency standard 204, through fixed reference divider 206. The frequency of the frequency standard output signal is divided by fixed reference divider 206 for input to circuit 202.

Circuit 202 comprises phase detector 208, loop filter 210, VCO 212, optional loop divider 214, DDS 216, DDS cleanup filter 218 and optional loop divider 220. The output from fixed reference divider 206, $f_r$, is provided as one input to phase detector 208. The output of phase detector 208 is coupled as previously discussed to the input of loop filter 210. The output of loop filter 210 is coupled as the control voltage to VCO 212.

The output of VCO 212 is provided as the frequency synthesizer output with the VCO output signal also fed back either directly or through optional loop divider 214 to the DDS clock input of DDS 216. DDS 216 is provided with a frequency control input signal which is used to set the DDS frequency. The output of DDS 216 is provided to filter 218. The output of filter 218 is provided either directly to or through optional loop divider 220 to the other input of phase detector 208.

In the particular embodiment of FIG. 3, the synthesizer output frequency is a function of the reference frequency $f_r$, input to phase detector 208 from fixed reference divider 206; the number of bits in the digital word of the frequency control signal which controls DDS 216, N; the DDS step size determined by the frequency control signal, A; and the values of the dividers 214 and 220, respectively X and Y. The following equation expresses the synthesizer output frequency $f_o$:

$$f_o = f_r 2^N \cdot (X \cdot Y / A). \tag{1}$$

In the embodiment of FIG. 3, DDS 216 and filter 218 are incorporated within the phase lock loop feedback path. Accordingly, filter 218 now has an affect upon the dynamics of the phase lock loop. In order to ensure loop stability, the bandwidth of filter 218 must be wide when compared to that of the loop bandwidth. Furthermore, it should be noted that the synthesizer step size is not constant, but is a function of the variable A, the frequency control signal. However, the embodiment of FIG. 3 realizes all of the other advantages of the embodiment of FIG. 2.

It is further envisioned that with respect to the embodiments of FIGS. 2 or 3 that several such circuits may be combined wherein each frequency synthesizer provides an output signal to a switching device, such as an FET transistor or PIN diode switch. Such a switching device would provide selection between the outputs of the multiple frequency synthesizer for an ultimate output signal. It should be readily understood that many various modifications utilizing the DDS and a phase lock loop forming a frequency synthesizer may be realized using the teachings disclosed herein.

The previous descriptions of the preferred embodiments are provided to enable any person skilled in the art to make or use the present invention. Various modifications to these embodiments will be readily apparent to those skilled in the art, and the generic principles defined herein may be applied to other embodiments without the use of the inventive facility. Thus, the present invention is not intended to be limited to the embodiments shown herein, but is to be accord of the widest scope consistent with the principles and novel features enclosed herein.

I claim:
1. An apparatus for synthesizing frequencies, comprising:
   variable reference means for generating a periodic signal of a frequency selected from a plurality of reference frequencies, said variable reference means comprising,
      phase accumulator means for, receiving a digital frequency control signal indicative of a selected phase increment value, receiving an externally generated clock signal, accumulating phase increment values at a rate corresponding to said clock signal, and providing an accumulator output signal corresponding to said accumulated phase increment values;
      memory means for storing a plurality of amplitude values each corresponding to a respective accumulated phase increment value, receiving said accumulator output signal and providing a memory output signal indicative of the amplitude value corresponding to each accumulated phase increment value of said accumulator output signal; and
      converter means for, receiving said memory output signal converting said received memory output signal to an analog amplitude signal corresponding to said memory output signal amplitude values, and providing said analog amplitude signal as said periodic signal; and
   frequency tuning means for receiving said periodic signal and generating an output signal of a frequency which is a multiple of said periodic signal frequency.

2. The apparatus of claim 1 wherein said frequency tuning means comprises:
   phase detector means for, receiving said periodic signal and a feedback signal, detecting a phase difference between said periodic signal and said feedback signal and providing a corresponding error signal:
   loop filter means for, receiving said error signal, filtering noise in said error signal, and providing a filtered error signal as a control signal;
   variable oscillator means for receiving said control signal and responsive thereto for generating said output signal;
   divider means for receiving said output signal dividing said output signal frequency by N, and providing said feedback signal corresponding in frequency to said output signal frequency divided by N, wherein said output signal frequency is N times said periodic signal frequency.

3. The apparatus of claim 1 further comprising filter means, disposed between said variable reference means and said frequency tuning means, for receiving said periodic signal, enhancing the spectral purity of said periodic signal and providing said spectral purity enhanced periodic signal to said frequency tuning means.

4. The apparatus of claim 2 further comprising filter means, disposed between said converter means and said phase detector means, for receiving said periodic signal, enhancing the spectral purity of said periodic signal and providing said spectral purity enhanced periodic signal to said phase detector means.

5. The apparatus of claim 4 further comprising additional divider means disposed between said filter means and said phase detector means for receiving said spectral purity enhanced periodic signal and providing to said phase detector means a divided frequency periodic signal corresponding in frequency to said periodic signal frequency divided by M, said output signal frequency being N times said divided frequency periodic signal frequency.

6. A frequency synthesizer comprising:
   a direct digital synthesizer (DDS) having, a fine frequency control input and a DDS clock input for respectively receiving externally generated phase data and an externally generated clock signal, and an output at which a reference signal is provided;

a filter having an input, coupled to said DDS output, and an output; and a phase lock loop having a loop input coupled to said filter output, a coarse frequency control input for receiving a divide-by-N signal, and a loop output wherein said loop provides at said loop output a synthesizer output signal of a frequency N times the frequency of said reference signal.

7. The synthesizer of claim 6 further comprising a frequency divider, disposed between said filter and said phase lock loop, having an input coupled to said filter output and an output coupled to said loop input, said frequency divider for dividing said reference signal frequency by M with said phase lock loop having a frequency of N times said reference signal frequency divided by M.

8. The synthesizer of claim 6 wherein said direct digital synthesizer comprises:

a phase accumulator having a phase data input for receiving said phase data, an accumulator clock input for receiving said clock signal, and an accumulator output;

a read only memory having a plurality of addressable storage locations each storing a predetermined sine value, an address input coupled to said accumulator output, a memory clock input for receiving said clock signal and a memory output;

a digital to analog converter having a converter input coupled to said memory output, a converter clock input for receiving said clock signal and a converter output.

9. The frequency synthesizer of claim 6 wherein said phase lock loop comprises:

a phase detector having a reference input coupled to said filter output, a feedback input and a detector output;

a loop filter having a loop filter input, coupled to said detector output, and a loop filter output;

a voltage controlled oscillator having a control input, coupled to said loop filter output, and an oscillator output, said synthesizer output signal being provided at said oscillator output; and a variable frequency divider having a divider input coupled to said oscillator output, a divider control input for receiving said divide-by-N signal, and a divider output coupled to said detector feedback input.

10. The frequency synthesizer of claim 8 wherein said phase lock loop comprises:

a phase detector having a reference input coupled to said filter output, a feedback input and a detector output;

a loop filter having a loop filter input coupled to said detector output and a loop filter output;

a voltage controlled oscillator having a control input, coupled to said loop filter output, and an oscillator output, said synthesizer output signal being provided at said oscillator output; and a variable frequency divider having a divider input coupled to said oscillator output, a divider control input for receiving said divide-by-N signal, and a divider output coupled to said detector feedback input.

11. The synthesizer of claim 10 further comprising a frequency divider, disposed between said filter and said phase lock loop, having an output coupled to said reference input, said frequency divider dividing said reference signal frequency by M, with said synthesizer output signal being of a frequency of N times said reference signal frequency divided by M.

12. A phase lock loop frequency synthesizer comprising:

a phase detector having a reference input for receiving an externally generated reference signal of a predetermined frequency, a feedback input and an output;

a loop filter having an input, coupled to said detector output, and an output;

a voltage controlled oscillator having an input, coupled to said loop filter output, and an output for providing a synthesizer output signal;

a direct digital synthesizer (DDS) having a DDS clock input coupled to said oscillator output, a frequency control input for receiving externally generated phase data, and an output; and a bandpass filter having an input coupled to said DDS output and an output coupled to said detector feedback input.

13. The synthesizer of claim 12 wherein said direct digital synthesizer comprises:

a phase accumulator having a phase data input for receiving said phase data, an accumulator clock input coupled to said oscillator output, and an accumulator output;

a read only memory having a plurality of addressable storage locations each storing a predetermined sine value, an address input coupled to said accumulator for output, a memory clock input coupled to said oscillator output and a memory output;

a digital to analog converter having a converter input coupled to said memory output, a converter clock input coupled to said oscillator output, and a converter output coupled to said bandpass filter input.

14. The synthesizer of claim 12 further comprising a first loop divider, disposed between said oscillator and said DDS, having an input coupled to said oscillator output and an output coupled to said DDS clock input, said first loop divider dividing said synthesizer output signal frequency by X as provided to said DDS clock input.

15. The synthesizer of claim 12 further comprising a loop divider, disposed between said bandpass filter and said phase detector, having an input coupled to said bandpass filter output and an output coupled to said detector feedback input, said loop divider dividing a signal output from said DDS in frequency by Y for providing to said detector feedback input.

16. The synthesizer of claim 14 further comprising a second loop divider, disposed between said bandpass filter and said phase detector, having an input coupled to said bandpass filter output and an output coupled to said detector feedback input, said second loop divider dividing a signal output from said DDS in frequency by Y for providing to said detector feedback input.

17. A method for synthesizing frequency comprising the steps of:

providing a direct digital synthesizer (DDS) capable of generating an analog DDS output signal at a frequency selected from a plurality of frequencies;

providing externally generated phase data and clock signals to said DDS;

generating in said DDS, in response to an input of said phase data and said clock signal, a DDS analog output signal having a frequency corresponding to said phase data;

providing a phase lock loop capable of generating a loop output signal at a frequency corresponding to an input reference signal and a divide-by-N signal;

providing to said phase lock loop, said DDS output signal as said reference signal, and said divide-by-N signal; and generating in said phase lock loop, in response to said input of said DDS output signal and said divide-by-N signal, said loop output signal corresponding in frequency to a multiple of aid generated DDS output signal.

18. The method of claim 17 further comprising the step of enhancing the spectral purity of said DDS output signal.

19. The method of claim 17 further comprising the steps of:
dividing said DDS output signal frequency; and
providing said divided frequency DDS output signal to said phase lock loop wherein said phase lock loop generates loop output signals at a frequency of N times said DDS output signal frequency divided by M.

* * * * *